(12) United States Patent
Matsumoto

(10) Patent No.: US 10,679,711 B2
(45) Date of Patent: Jun. 9, 2020

(54) MEMORY SYSTEM INCLUDING POWER SUPPLY CONTROL CIRCUIT AND TEMPERATURE SENSOR, AND CONTROL METHOD THEREOF

(71) Applicant: Toshiba Memory Corporation, Minato-ku, Tokyo (JP)

(72) Inventor: Hajime Matsumoto, Higashimurayama (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/055,593

(22) Filed: Aug. 6, 2018

(65) Prior Publication Data
US 2019/0295663 A1   Sep. 26, 2019

(30) Foreign Application Priority Data

Mar. 22, 2018   (JP) .................................. 2018-053940

(51) Int. Cl.
| | | |
|---|---|---|
| *G11C 5/14* | (2006.01) | |
| *G11C 16/30* | (2006.01) | |
| *G11C 7/04* | (2006.01) | |
| *G11C 11/4074* | (2006.01) | |

(52) U.S. Cl.
CPC .............. *G11C 16/30* (2013.01); *G11C 5/147* (2013.01); *G11C 7/04* (2013.01); *G11C 11/4074* (2013.01)

(58) Field of Classification Search
CPC ........... G11C 16/30; G11C 5/147; G11C 7/04; G11C 11/4074
See application file for complete search history.

(56) References Cited

U.S. PATENT DOCUMENTS

| | | |
|---|---|---|
| 6,732,304 B1 | 5/2004 | Ong |
| 6,754,866 B1 | 6/2004 | Ong et al. |
| 6,812,726 B1 | 11/2004 | Ong |
| 7,006,940 B1 | 2/2006 | Ong |
| 7,365,557 B1 | 4/2008 | Ong |
| 7,446,551 B1 | 11/2008 | Ong |
| 7,463,999 B2 | 12/2008 | Li |
| 7,673,193 B1 | 3/2010 | Ong et al. |
| 9,471,117 B1 | 10/2016 | Spangler |
| 10,001,936 B2* | 6/2018 | Matsumoto ............. G06F 1/189 |
| 10,195,898 B2* | 2/2019 | Toros .................... B60B 39/021 |
| 10,242,716 B2* | 3/2019 | Kimura .................... G11C 5/04 |
| 10,299,381 B2* | 5/2019 | Kimura ................. H05K 1/111 |
| 10,338,634 B2* | 7/2019 | Kumagai ............. H05K 1/0271 |
| 2004/0019841 A1 | 1/2004 | Ong |

(Continued)

FOREIGN PATENT DOCUMENTS

| | | |
|---|---|---|
| TW | 200717002 A | 5/2007 |
| TW | 201406179 A | 2/2014 |

*Primary Examiner* — Gene N Auduong
(74) *Attorney, Agent, or Firm* — White & Case LLP

(57) ABSTRACT

According to one embodiment, a memory system includes first, second, and third ICs. The first IC includes a non-volatile semiconductor memory. The second IC includes a controller configured to control the non-volatile semiconductor memory. The third IC is configured to receive an external first power supply voltage and generate a second power supply voltage. The third IC is connected to the second IC via an interface according to a serial communication standard. A temperature sensor element is connected to the third IC.

15 Claims, 5 Drawing Sheets

(56) References Cited

U.S. PATENT DOCUMENTS

| | | |
|---|---|---|
| 2004/0100296 A1 | 5/2004 | Ong |
| 2005/0024977 A1 | 2/2005 | Ong |
| 2005/0162183 A1 | 7/2005 | Choo et al. |
| 2005/0289428 A1 | 12/2005 | Ong |
| 2006/0150046 A1 | 7/2006 | Ong |
| 2006/0152241 A1 | 7/2006 | Ong |
| 2006/0279308 A1 | 12/2006 | Ong |
| 2007/0013402 A1 | 1/2007 | Ong et al. |
| 2007/0067687 A1 | 3/2007 | Ong |
| 2007/0079204 A1 | 4/2007 | Ong |
| 2007/0094555 A1 | 4/2007 | Ong et al. |
| 2007/0113126 A1 | 5/2007 | Ong |
| 2007/0168808 A1 | 7/2007 | Ong |
| 2008/0278190 A1 | 11/2008 | Ong et al. |
| 2011/0251819 A1 | 10/2011 | Ong |
| 2015/0268101 A1 | 9/2015 | Kumahara et al. |
| 2017/0140825 A1 | 5/2017 | Park et al. |

\* cited by examiner

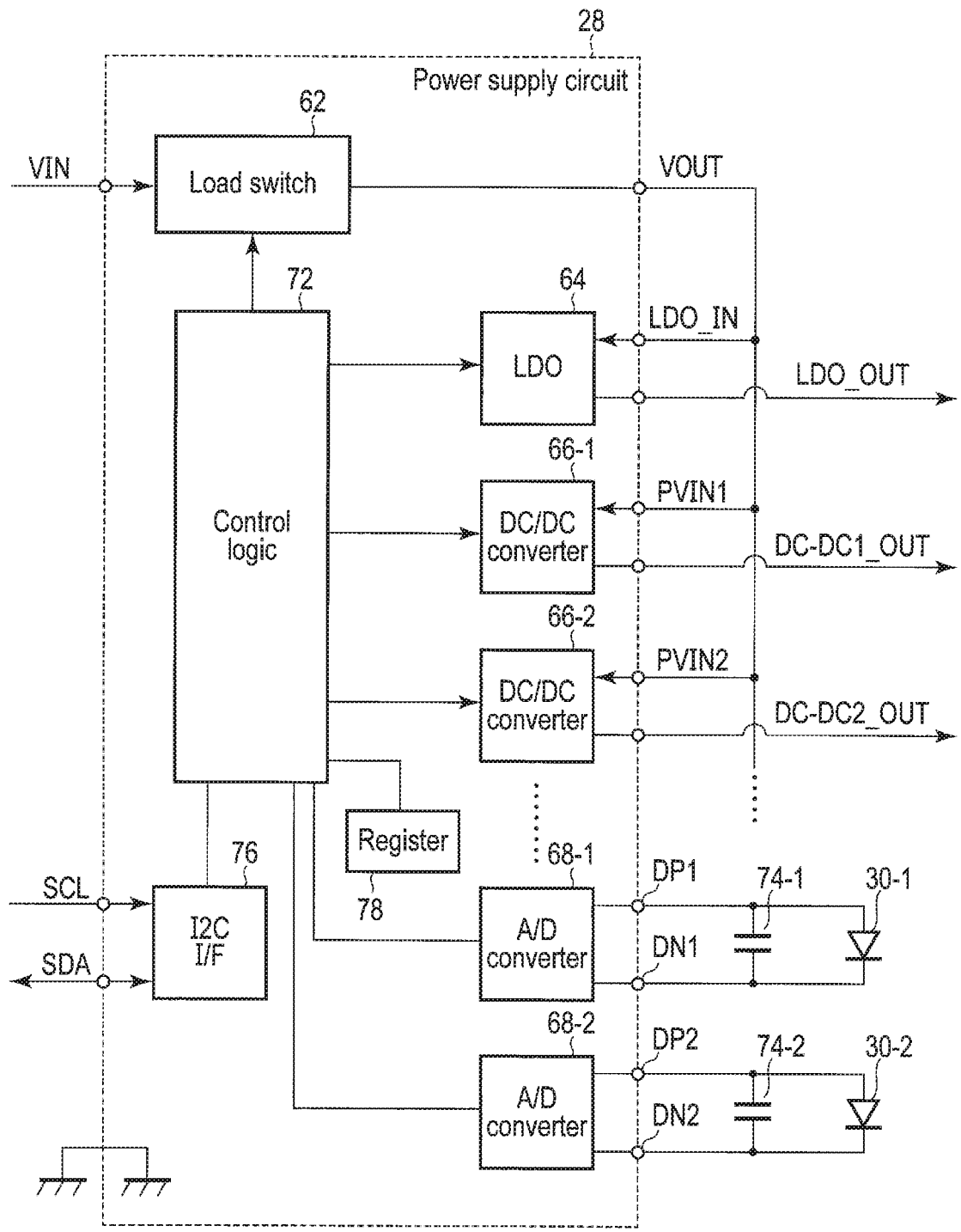
F I G. 3

MEMORY SYSTEM INCLUDING POWER SUPPLY CONTROL CIRCUIT AND TEMPERATURE SENSOR, AND CONTROL METHOD THEREOF

CROSS-REFERENCE TO RELATED APPLICATIONS

This application is based upon and claims the benefit of priority from Japanese Patent Application No. 2018-053940, filed Mar. 22, 2018, the entire contents of which are incorporated herein by reference.

FIELD

Embodiments described herein relate generally to a memory system including a non-volatile semiconductor memory, a power supply control circuit, and a control method.

BACKGROUND

A memory system including a non-volatile semiconductor memory such as flash memory, or the like, called a solid state drive (hereinafter, referred to as an SSD) has been developed. In the SSD, components made of integrated circuits (ICs) such as a flash memory, a controller, a power supply circuit, a temperature sensor, and the like, are provided on a substrate. A temperature of the flash memory may become high during an operation of the flash memory. A temperature sensor detecting the temperature of the flash memory is provided. The temperature sensor periodically transmits the measured temperature to the controller. The temperature sensor and the power supply circuit are connected to the controller by an interface of the same serial communication standard, and are respectively controlled by the controller. For this reason, wiring patterns independently connected from the controller to each of the temperature sensor and the power supply circuit need to be formed on the substrate.

BRIEF DESCRIPTION OF THE DRAWINGS

FIG. 3 is a block diagram showing an example of a configuration of a power supply circuit of the SSD according to an embodiment.

DETAILED DESCRIPTION

Figure 1:
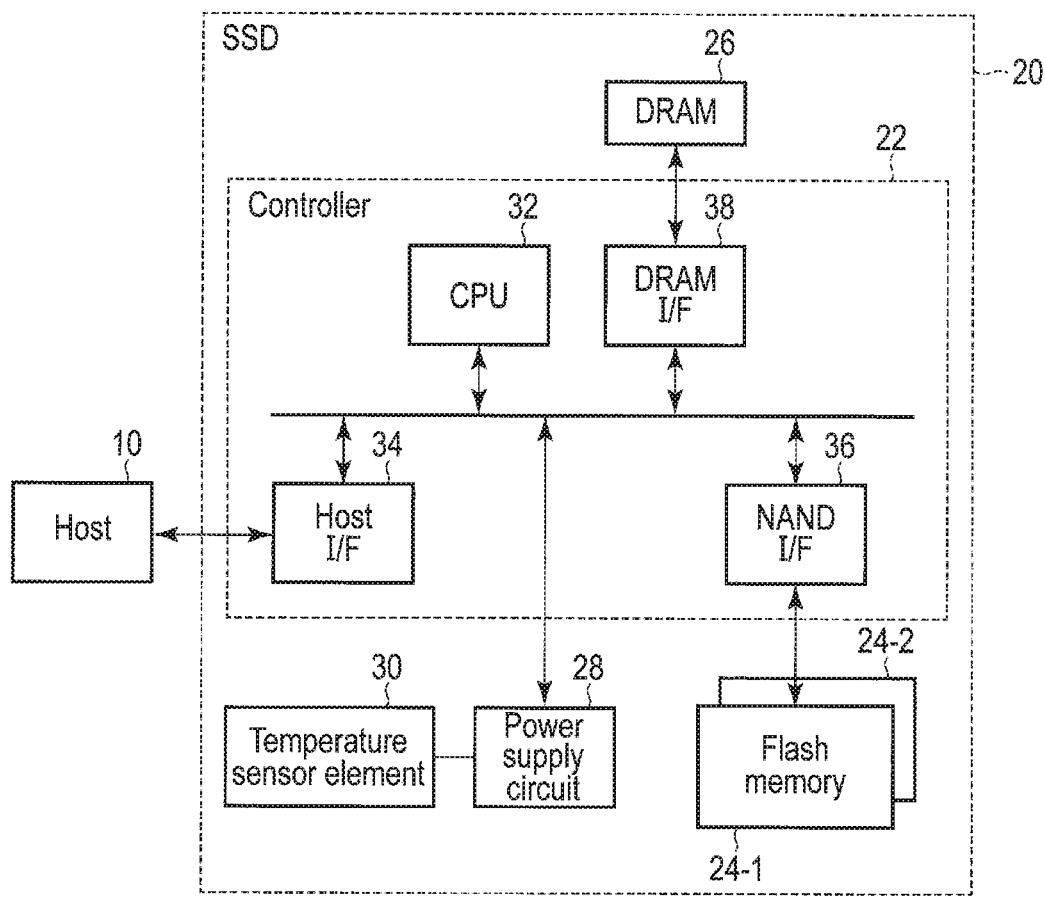
FIG. 1 is a block diagram showing an example of a configuration of a solid state drive (SSD) according to an embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a memory system includes a substrate, a first integrating circuit, a second integrating circuit, a third integrating circuit, and a temperature sensor element. The first integrated circuit is provided on the substrate and includes a non-volatile semiconductor memory. The second integrated circuit is provided on the substrate and includes a controller configured to control the non-volatile semiconductor memory. The third integrated circuit is provided on the substrate and configured to receive a first power supply voltage supplied from an outside of the third integrated circuit and generate a second power supply voltage having a value different from a value of the first power supply voltage, wherein the third integrated circuit is connected to the second integrated circuit via an interface according to a serial communication standard. The temperature sensor element is provided on the substrate and connected to the third integrated circuit.

First Embodiment

[Information Processing System]

An electrical configuration of an information processing system including a memory system according to an embodiment will be described with reference to FIG. 1. The information processing system includes a host device (hereinafter, referred to as a host) 10 and a memory system 20. The memory system 20 is a semiconductor storage device configured to write data to a non-volatile semiconductor memory and to read data from the non-volatile semiconductor memory. The memory system 20 is realized as a solid state drive (SSD) including the non-volatile semiconductor memory, for example, a NAND type flash memory. Hereinafter, the memory system 20 will be referred to as the SSD 20. The NAND type flash memory is used as the non-volatile semiconductor memory in a first embodiment, but other non-volatile semiconductor memories may also be used as the non-volatile semiconductor memory.

The host 10 is an information processing apparatus (also referred to as a computing device) that accesses the SSD 20. The host 10 may be a server (also referred to as a storage server) that causes the SSD 20 to store large and various data, or may be a personal computer.

The SSD 20 can be used as a main storage of the information processing apparatus functioning as the host 10. The SSD 20 may be provided in the information processing apparatus or may be connected to the information processing apparatus through a cable or a network.

As an interface for electrically interconnecting the host 10 and the SSD 20, a standard such as small computer system interface (SCSI) (registered trademark), PCI Express (registered trademark) (also referred to as PCIe (registered trademark)), Serial Attached SCSI (SAS) (registered trademark), Serial Advanced. Technology Attachment (SAMA) (registered trademark), Non Volatile Memory Express (NVMe (registered trademark)), Universal Serial Bus (USB) (registered trademark), or the like, can be used.

The SSD 20 includes a controller 22 and flash memories 24-1 and 24-2 (collectively referred to as a flash memory 24). The controller 22 controls read and write of the flash memory 24. The flash memory 24 may include a plurality of flash memory chips (that is, a plurality of flash memory dies). Here, two flash memories 24-1 and 24-2 are provided as an example. Each chip is realized as a flash memory configured to store one bit or a plurality of bits per memory cell.

The controller 22 includes a central processing unit (CPU) 32, a host I/F 34, a NAND I/F 36, and a dynamic random access memory (DRAM) I/F 38 which are connected to a bus line 40. The controller 22 can be realized by an integrated circuit such as a system-on-a-chip (SoC). The SSD 20 may include a random access memory, for example, a DRAM 26, which is a volatile memory. The DRAM 26 may be provided outside the controller 22. Alternatively, a random access memory capable of realizing higher speed access, such as a static random access memory (SRAM), may be provided in the controller 22.

The random access memory such as the DRAM 26, or the like, may be provided with a write buffer, a read buffer, a cache region, a storage region, or the like. The write buffer is a buffer region for temporarily storing data to be written in the flash memory 24. The read buffer a buffer region for temporarily storing data read from the flash memory 24. The cache region stores a look-up table (referred to as an LUT) functioning as an address translation table (also referred to as a logical address/physical address translation table). The storage region stores system. management information such as various values, various tables, or the like, used during processing of the SSD 20. The LUT manages mapping between each of logical addresses of data and each of physical addresses of the flash memory 24.

The SSD 20 also includes a power supply circuit 28 and a temperature sensor element 30. The power supply circuit 28 generates power supply voltages necessary for the SSD 20 from a power supply voltage supplied from the host 10. The power supply circuit 28 is manufactured in a form of an integrated circuit (IC). A control signal of the power supply circuit 28 is supplied from the controller 22 according to a serial communication standard, for example, an I2C standard. The temperature sensor element 30 includes a component such as a diode, a bipolar transistor, or the like, and is connected to the power supply circuit (IC) 28. Temperature data measured by the temperature sensor element 30 are also transmitted from the power supply circuit 28 to the controller 22 according to the same serial communication standard as the control signal, for example, the I2C standard. The controller 22 is also a power supply control circuit controlling the power supply voltages of the power supply circuit 28 based at least in part on a temperature.

[SSD]

Figure 2:
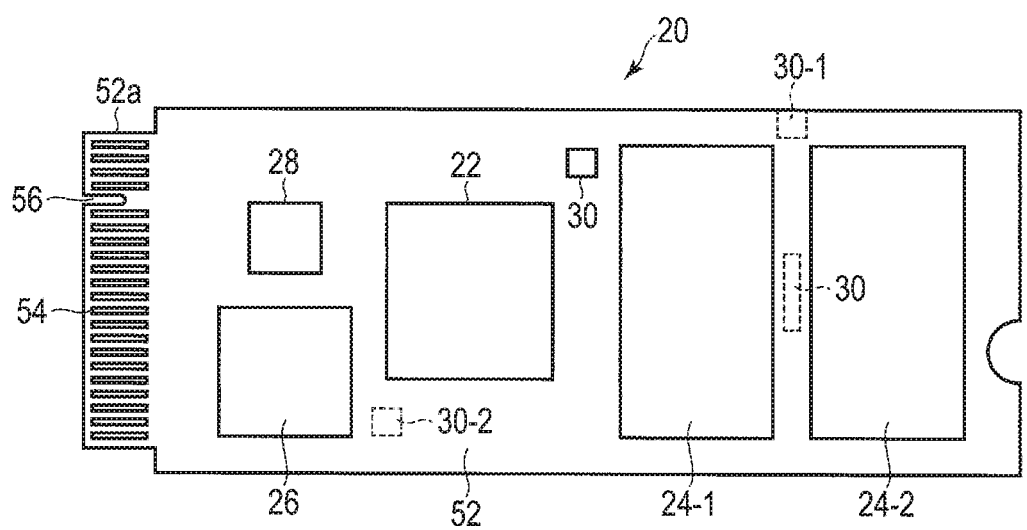
FIG. 2 is a plan view showing an example of a chip arrangement of the SSD according to the embodiment.

FIG. 2 is a plan view showing an example of an appearance of the SSD 20. The SSD 20 includes a substrate 52 for mounting components. Here, the substrate 52 has a substantially rectangular shape. In recent years, as a standard of the substrate 52, there is an M.2 standard defined for a form factor and a connection terminal of a built-in expansion card of a computer. Although various sizes are proposed in the M.2 standard, for example, 22 mm×42 mm, 22 mm×60 mm, 22 mm×80 mm, and a very small type are also provided in the M.2 standard. As the SSD 20 is miniaturized, the flash memory 24 is also miniaturized. A temperature of the flash memory 24 that is miniaturized may become high at the time of an operation of the flash memory 24. The controller 22, the flash memories 24-1 and 24-2, the DRAM 26, and the power supply circuit 28, which are components manufactured in a form of an IC, are mounted on the substrate 52. A temperature sensor element 30, which is a component, is also mounted on the substrate 52. The temperature sensor element 30 measures the temperature of the flash memory 24.

The substrate 52 may have a single layer structure formed of a synthetic resin such as an epoxy resin, etc., but may have a multilayer structure. Wiring patterns having various forms are formed on surfaces of the respective layers. For example, a signal layer performing transmission and reception of signals, a ground layer, a power supply layer, and the like, may be formed. A connector portion 54 electrically connected to the host 10 is provided at a side end 52a of one of the short sides of the substrate 52. A wiring pattern (not shown) formed on the substrate 52 is electrically connected to predetermined terminal pins of the connector portion 54. A slit 56 is formed at a specific position of the side end 52a, for example, at a position deviating from the center of a short side direction of the side end 52a. The slit 56 is configured to be engaged with a protrusion (not shown), or the like, provided on the host 10. This prevents the SSD 20 (the substrate 52) from being attached to the host 10 with the front and the back surfaces reversed. In addition, a notch is also formed at an arbitrary position deviating from the center of a side end of an opposite side to the side end 52a. The front and the back surfaces of the SSD 20 (the substrate 52) can be recognized even by a position of the notch.

Positions of the controller 22, the flash memories 24-1 and 24-2, the DRAM 26, the power supply circuit 28, and the temperature sensor element 30 mounted on the substrate 52 are not limited. In the example of FIG. 2, the power supply circuit 28 and the DRAM 26 are mounted at positions closest to the connector portion 54. The flash memories 24-1 and 24-2 are mounted at positions farthest from the connector 54. The controller 22 is mounted between the power supply circuit 28 and the DRAM 26, and the flash memories 24-1 and 24-2. In order to measure the temperature of the flash memory 24, the temperature sensor element 30 is provided in the vicinity of the flash memory 24. Since a temperature of the DRAM 26 also rises during an operation of the DRAM 26, when the temperatures of the DRAM 26 and the flash memories 24-1 and 24-2 are to be measured, the temperature sensor element 30 is provided in the vicinity of the DRAM 26 and the flash memories 24-1 and 24-2.

The temperature sensor element 30 is very small, and a degree of freedom of a position at which the temperature sensor element 30 is mounted on the substrate 52 is considerably high. For example, the temperature sensor element 30 can also be disposed between the flash memories 24-1 and 24-2, as shown in the broken line in FIG. 2. The number of temperature sensor elements is not limited to one, but plural temperature sensor elements may also be mounted. When two temperature sensor elements 30-1 and 30-2 are mounted, the temperature sensor element 30-1 may be provided in the vicinity of the flash memories 24-1 and 24-2, and the temperature sensor element 30-2 may be provided in the vicinity of the DRAM 26, as shown in the broken line in FIG. 2.

The temperature sensor element 30 is connected to the power supply circuit 28 using any of various wiring patterns formed on a mounting surface of the substrate 52 or at least one of various wiring patterns formed on multiple layers. A plurality of pads may be provided on the wiring patterns on the mounting surface. The temperature sensor element 30 may be mounted on any of the plurality of pads.

[Power Supply Circuit]

FIG. 3 shows an example of a circuit diagram of the power supply circuit 28. The power supply circuit 28 includes a load switch 62, a linear regulator 64 also called a low dropout (LDO), DC/DC converters 66-1, 66-2, ... (also collectively denoted as a DC/DC converter 66), A/D converters 68-1 and 68-2 (also collectively denoted as a A/D converter 68), an I2C I/F 76, a register 78, and a control logic 72. A power supply voltage VIN supplied from the host 10 is input to the load switch 62. The load switch 62 is turned on/off based at least in part on a control signal from the control logic 72, and outputs a power supply voltage VOUT during a turn-on period. The power supply voltage VOUT is output to the outside of the power supply circuit 28 through a pin of the power supply circuit 28.

The power supply voltage VOUT output to the outside of the power supply circuit 28 is taken into the power supply circuit 28 through another pin of the power supply circuit 28, and is input as a voltage LDO_IN to the LDO 64. The LDO 64 is turned on/off based at least in part on a control signal from the control logic 72, and outputs an internal power supply voltage LDO_OUT during a turn-on period. A value of the power supply voltage LDO_OUT is adjusted by a voltage control of the LDO 64. The power supply voltage LDO_OUT is output to the outside of the power supply circuit 28 through a pin of the power supply circuit 28. The power supply voltage LDO_OUT is, for example, analog power of the controller 22. The input voltage of the LDO 64 is not limited to the output voltage VOUT of the load switch 62, but may be another voltage.

The power supply voltage VOUT output to the outside of the power supply circuit 28 is taken into the power supply circuit 28 through another pin of the power supply circuit 28, and is input as voltages PVIN1, PVIN2, ... to the DC/DC converters 66-1, 66-2, .... The DC/DC converters 66-1, 66-2, ... are turned on/off or voltage-controlled based at least in part on a control signal from the control logic 72, and output internal power supply voltages DC-DC1_OUT, DC-DC2_OUT, ..., respectively. Values of the power supply voltages DC-DC1_OUT, DC-DC2_OUT, ... are adjusted by voltage controls of the DC/DC converters 66-1, 66-2, ..., respectively. The power supply voltages DC-DC1_OUT, DC-DC2_OUT, ... are output to the outside of the power supply circuit 28 through pins of the power supply circuit 28. The power supply voltages DC-DC1_OUT, DC-DC2_OUT, ... are, for example, power of the CPU 32, power of the host I/F 34, power of the NAND I/F 36, and power of the DRAM I/F 38 of the controller 22. The input voltages of DC/DC converters 66-1, 66-2, ... are not limited to the output voltage VOUT of the load switch 62, but may be other voltages.

Here, an example in which two temperature sensor elements 30-1 and 30-2 are mounted will be described, but the number of temperature sensor elements 30 may also be one. Examples of the temperature sensor elements 30 are various, but here, diodes 30-1 and 30-2 are used as the temperature sensor elements 30. Since a forward voltage of the diode 30 is linearly decreased when a temperature rises, the diode 30 can be used as the temperature sensor element. For example, the diode 30-1 provided in the vicinity of the flash memories 24-1 and 24-2 (shown in FIG. 2) is connected to a diode positive (anode) connection pin DP1 and a diode negative (cathode) connection pin DN1 of the power supply circuit 28. The power supply circuit 28 may also include a bias (voltage application/current supply) circuit (not shown) to the diode 30-1 to perform voltage application/current supply to the diode 30-1 through the pins DP1 and DN1. Alternatively, a bias circuit to the diode 30-1 may be separately provided outside the power supply circuit 28. The pin DP1 and the pin DN1 are connected to the A/D converter 68-1. A capacitor 74-1 for cancelling noise is connected to the diode 30-1 in parallel. Similarly, the diode 30-2 provided in the vicinity of the DRAM 26 (shown in FIG. 2) is connected to a diode positive (anode) connection pin DP2 and a diode negative (cathode) connection pin DN2 of the power supply circuit 28. The pin DP2 and the pin DN2 are connected to the A/D converter 68-2. A capacitor 74-2 for cancelling noise is connected to the diode 30-2 in parallel.

The pin DP1 and the pin DN1 are connected to the A/D converter 68-1, and the pin DP2 and the pin DN2 are connected to the A/D converter 68-2. The A/D converters 68-1 and 68-2 respectively receive analog forward voltages of the diodes 30-1 and 30-2 and convert the analog input voltages into respective digital data to obtain respective temperature data. The temperature data are supplied to the control logic 72. The control logic 72 stores the temperature data measured by the diodes 30-1 and 30-2 in the register 78. The storing of the temperature data in the register 78 is periodically performed based at least in part on an internal clock of the control logic 72, and the temperature data in the register 78 are periodically updated. The I2C I/F 76 is connected to the control logic 72, and performs I2C communication, which is an example of a serial communication standard, with the controller 22 through a clock line SCL and a data line SDA based at least in part on a control signal from the control logic 72. The I2C I/F 76 receives voltage control signals/voltage adjusting signals transmitted from the controller 22, and supplies these signals to the control logic 72. The voltage control signals are signals for setting output voltages of the load switch 62, the LDO 64, the DC/DC converters 66-1, 66-2, ... and the voltage adjusting signals are signals for adjusting the output voltage of the load switch 62, the LDO 64, the DC/DC converters 66-1, 66-2, ... at the time of a temperature change, or the like. Further, the I2C I/F 76 transmits the temperature data stored in the register 78 to the controller 22 in response to a request from the controller 22.

[I2C Communication]

Figure 4:
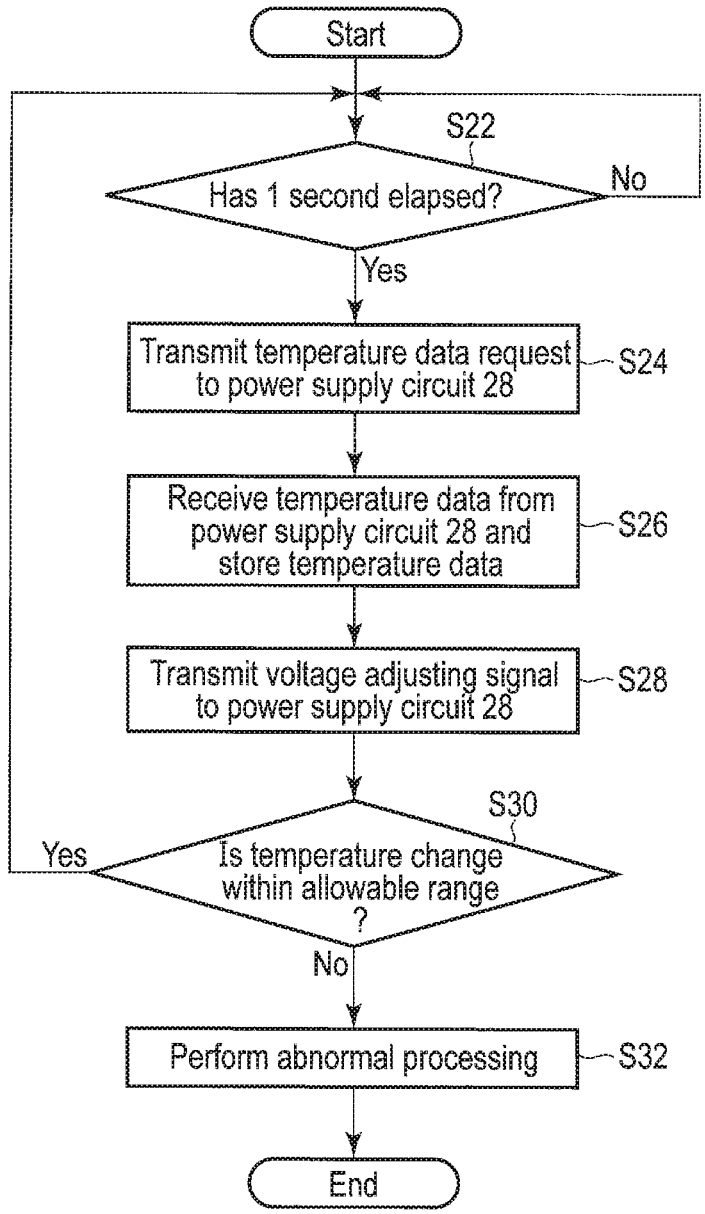
FIG. 4 is a flowchart showing an example of operations of the SSD according to the embodiment.

An example of communication between the controller 22 and the power supply circuit 28 will be described with reference to FIGS. 4 and 5. FIG. 4 is a flowchart showing operations of the controller 22. In S22, the controller 22 determines whether or not an embedded timer (not shown) has counted 1 second. The controller 22 waits in S22 until 1 second is counted. When the timer has counted 1 second, the controller 22 transmits a temperature data request to the power supply circuit 28 through the clock line SCL and the data line SDA in S24. The power supply circuit 28 transmits temperature data stored in the register 78 to the controller 22 in response to the temperature data request. The controller 22 receives the temperature data transmitted from the power supply circuit 28 through the clock line SCL and the data line SDA and stores the temperature data in an internal memory, (not shown), in S26. In this way, the controller 22 can obtain the temperature data of the SSD 20 every second.

The controller 22 performs a control based at least in part on the temperature data in S28. For example, the controller 22 transmits the voltage adjusting signals for adjusting values of the power supply voltages LDO_CUT, DC-DC1_OUT, DC-DC_OUT, ... based at least in part on the temperature data to the power supply circuit 28 through the clock line SCL and the data line SDA. When there is no temperature change, the power supply voltages do not need to be changed. Therefore, the controller 22 does not transmit the voltage adjusting signals to the power supply circuit 28. The controller 22 determines whether or not the temperature change is within an allowable range, in S30. When the temperature change is within the allowable range, the controller 22 again executes processing of S22, and when the temperature change is not within allocable range, the controller 22 may perform abnormal processing such as a stop of an operation of the SSD 20 in S32.

Figure 5A:
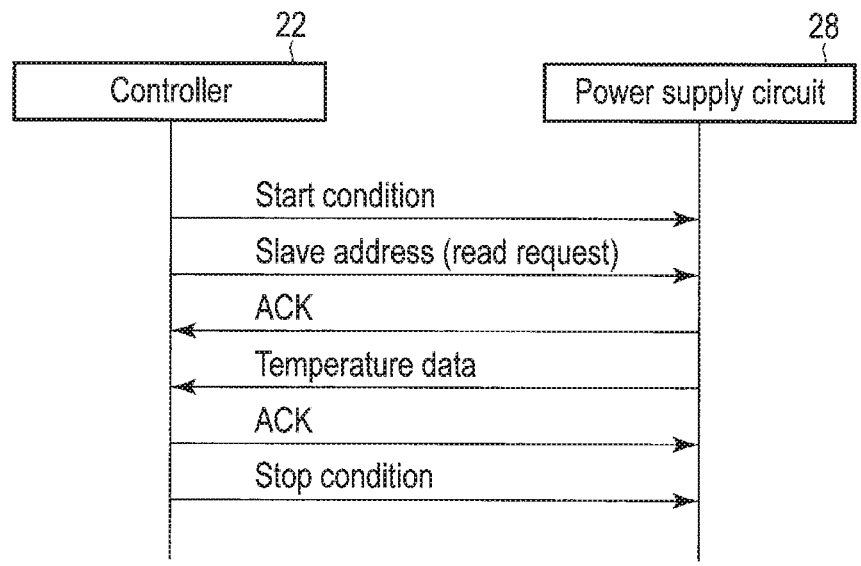
FIGS. 5A and 5B are views showing examples of I2C communication between a controller 22 and a power supply circuit 28 in the SSD according to the embodiment.

FIG. 5A shows an example of signals at the time of communication of the temperature data between the controller 22 and the power supply circuit 28. The controller 22 transmits a start condition to the power supply circuit 28. The controller 22 transmits the start condition to the power supply circuit 28 by changing the level of the data line SDA to a low level while maintaining the level of the clock line SCL at a high level.

The controller 22 transmits a clock signal through the clock line SCL, and transmits a slave address (here, an address of the power supply circuit 28) and a read request to the power supply circuit 28 through the signal line SDA in synchronization with the clock signal. Therefore, thereafter, the controller 22 and the power supply circuit 28 specified by the slave address communicate with each other in a one-to-one manner.

When the power supply circuit 28 receives the read request, the power supply circuit 28 transmits an acknowledge ACK to the controller 22 through the sig line SDA. Thereafter, the power supply circuit 28 reads the temperature data from the register 78, and transmits the temperature data to the controller 22 through the signal line SDA.

When the controller 22 receives the temperature data, the controller 22 transmits an acknowledge ACK to the power supply circuit 28 through the signal line SDA. Thereafter, the controller 22 transmits a stop condition to the power supply circuit 28. The controller 22 transmits the stop condition to the power supply circuit 28 by setting the level of the data line SDA to the low level and stopping the clock signal, and then setting the level of the clock line SCL to the high level and setting the level of the data line SDA to the high level for a predetermined time.

Figure 5B:
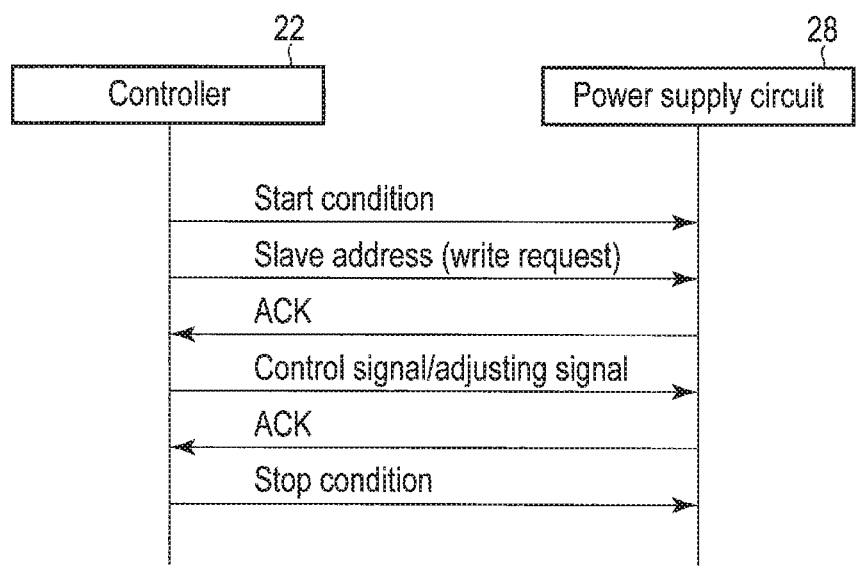

FIG. 5B shows an example of signals when the voltage control signals/voltage adjusting signals are transmitted from the controller 22 to the power supply circuit 28. The controller 22 transmits the start condition to the power supply circuit 28.

The controller 22 transmits a slave address (here, an address of the power supply circuit 28) and a write request to the power supply circuit 28. When the controller 22 receives an acknowledge ACK from the power supply circuit 28 through the signal line SDA, the controller 22 transmits the voltage control signals or the voltage adjusting signals to the power supply circuit 28 through the signal line SDA.

When the controller 22 receives an acknowledge ACK from the power supply circuit 28 through the signal line SDA, the controller 22 transmits the stop condition to the power supply circuit 28.

Modified Example

Figure 6A:
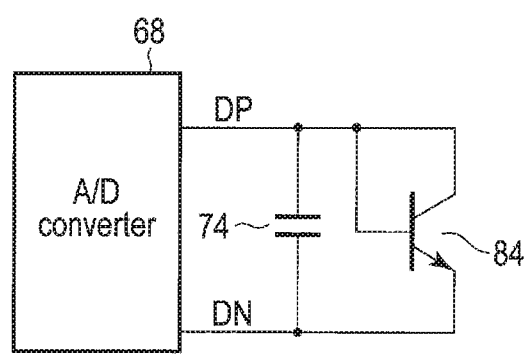
FIGS. 6A and 6B are views showing examples of a temperature sensor in the SSD of the embodiment.
Figure 6B:
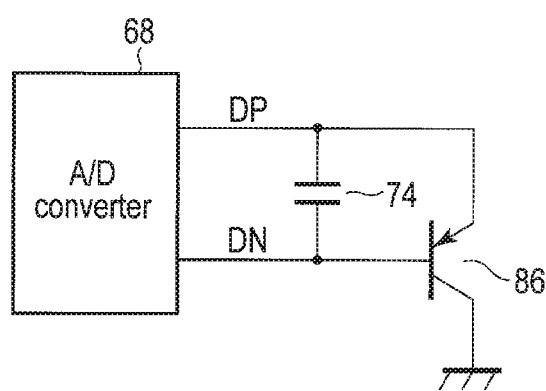

The temperature sensor element 30 is not limited to the diode, but can also be a bipolar transistor. FIG. 6A shows an example in which an NPN transistor 84 is used as the temperature sensor element. FIG. 6B shows an example in which a PNP transistor 86 is used as the temperature sensor element. As shown in FIG. 6A, a base and a collector of the NPN transistor 84 are connected to each other and further connected to a diode positive (anode) connection pin DP, and an emitter of the NPN transistor 84 is connected to a diode negative (cathode) connection pin DN. A capacitor 74 for cancelling noise is connected between the pin DP and the pin DN. As shown in FIG. 6B, a collector of the PNP transistor 86 is grounded, an emitter of the PNP transistor 86 is connected to the pin DP, and a base of the PNP transistor 86 is connected to the pin DN. The capacitor 74 for cancelling noise is connected between the pin DP and the pin DN. A bias circuit to the transistor 84 or 86 may be included in the power supply circuit 28 or may be separately provided outside the power supply circuit 28.

Even though the transistor 84 or 86 having the configuration described above is connected to an A/D converter 68, the A/D converter 68 can detect a voltage based at least in part on a temperature.

In the embodiment, the controller 22 transmits the voltage adjusting signals for adjusting the values of the power supply voltages based at least in part on the temperature data to the power supply circuit 28, but the control logic 72 in the power supply circuit 28 determines the temperature change in order to adjust the values of the power supply voltages by the power supply circuit 28 regardless of an instruction from the controller 22.

Effect of Embodiment

According to the embodiment, the temperature supply circuit 28 manufactured in the form of the IC, and the temperature data are transmitted to the controller 22 through the I2C I/F 76 included in the power supply circuit 28. Therefore, a mounting area and a manufacturing cost of the temperature sensor are reduced. For example, it is assumed that a temperature sensor IC is provided separately from the power supply circuit (IC) 28, and the power supply circuit (IC) 28 and the temperature sensor IC are connected to the controller (IC) 22 is considered. For example, a size of the temperature sensor IC is expected to be 1 mm square, but a size of the temperature sensor element 30 can be 0.5 mm square or less. For this reason, the temperature sensor element 30 can be installed even at a place where the temperature sensor IC cannot be installed. Therefore, a degree of freedom in mounting the temperature sensor element 30 can be increased and a component mounting area can be reduced. For example, the temperature sensor element 30 can be installed in a narrow gap between the flash memory 24-1 or 24-2 and an end portion of the substrate or a narrow gap between the flash memories 24-1 and 24-2.

In addition, since the power supply circuit 28 also generates heat, when the temperature sensor element 30 is provided in the power supply circuit 28, the temperature sensor element 30 also measures a temperature of the power supply circuit 28. Therefore, the temperature of the flash memory 24 cannot be correct measured. However, when the temperature sensor element 30 is externally attached to the power supply circuit 28 and is provided in the vicinity of the flash memory 24 as in the embodiment, the temperature of the flash memory 24 can be accurately measured.

According to the embodiment, the temperature data are transmitted to the controller 22 through the I2C I/F 76 of the power supply circuit 28, and the voltage control signals are transmitted from the controller 22 to the power supply circuit 28 through the same I2C I/F 76. For this reason, it is not necessary to provide signal lines for serial communication from the controller 22 to each of the power supply circuit 28 and the temperature sensor IC as in the related art. Therefore, an increase in a size of the controller 22 is prevented, and a design of the substrate becomes easy.

The above description is provided with respect to the temperature sensor, but the invention can be similarly applied to other sensors wherein the sensors are connected to the power supply circuit and output data of the sensors are transmitted to the controller by an interface according to a serial communication standard. An example of these sensors includes a humidity sensor, an acceleration sensor, a pressure sensor, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a substrate;
a first integrated circuit provided on the substrate and comprising a non-volatile semiconductor memory;
a second integrated circuit provided on the substrate and comprising a controller configured to control the non-volatile semiconductor memory;
a third integrated circuit provided on the substrate and configured to receive a first power supply voltage supplied from an outside of the third integrated circuit and generate a second power supply voltage having a value different from a value of the first power supply voltage, wherein the third integrated circuit is connected to the second integrated circuit via an interface according to a serial communication standard and the third integrated circuit includes a terminal; and
a temperature sensor element provided on the substrate and connected to the terminal of the third integrated circuit.

2. The memory system according to claim 1, wherein the third integrated circuit comprises:
a power supply circuit configured to generate power supply voltages for the non-volatile semiconductor memory and the controller;
a register configured to store temperature data sensed by means of the temperature sensor element; and
a communication circuit configured to transmit the temperature data stored in the register to the second integrated circuit via the interface.

3. The memory system according to claim 2, wherein
the third integrated circuit comprises a converter configured to convert an analog temperature signal output from the temperature sensor element into the temperature data, and
the temperature sensor element is connected to the converter with a capacitor connected in parallel to the temperature sensor element.

4. The memory system according to claim 2, wherein the third integrated circuit is configured to
receive the control signal transmitted from the second integrated circuit by the communication circuit,
control the power supply circuit based at least in part on the control signal received,
receive a request signal transmitted from the second integrated circuit by the communication circuit, and
transmit the temperature data stored in the register to the second integrated circuit by the communication circuit in response to the request signal received.

5. The memory system according to claim 2, wherein the power supply circuit comprises:

a load switch configured to perform switching so that the first power supply voltage is supplied to a subsequent circuit or is not supplied to the subsequent circuit;
a linear regulator configured to convert an output of the load switch into a first internal power supply voltage; and
a converter configured to convert the output of the load switch into a second internal power supply voltage, and wherein
the second power supply voltage comprises the first internal power supply voltage and the second internal power supply voltage.

6. The memory system according to claim 1, wherein
the substrate comprises a wiring pattern including plural pads, and
the temperature sensor element is mounted on one of the plural pads.

7. The memory system according to claim 1, wherein the temperature sensor element comprises a diode or a bipolar transistor.

8. The memory system according to claim 1, wherein the interface according to the serial communication standard comprises at least a first wiring configured to transmit a clock signal and a second wiring configured to transmit a data signal.

9. A power supply control circuit integrated and comprising a terminal to which a temperature sensor element is externally connected, the power supply control circuit comprising:
a power supply circuit configured to convert an external power supply voltage having a first value into an internal power supply voltage having a second value;
an analog to digital converter configured to convert an analog temperature signal supplied from the temperature sensor element into digital temperature data; and
a communication circuit configured to receive, via an interface according to a serial communication standard, a control signal to the power supply circuit supplied from an outside of the power supply control circuit and transmit, via the interface according to the serial communication standard, the temperature data to the outside of the power supply control circuit.

10. The power supply control circuit according to claim 9, wherein the power supply circuit comprises:
a load switch configured to perform switching so that the external power supply voltage is supplied to a subsequent circuit or is not supplied to the subsequent circuit;
a linear regulator configured to convert an output of the load switch into a first internal power supply voltage; and
a direct-current to direct-current converter configured to convert the output of the load switch into a second internal power supply voltage, and wherein
the internal power supply voltage comprises the first internal power supply voltage and the second internal power supply voltage.

11. The power supply control circuit according to claim 9, wherein the temperature sensor element is connected to the analog to digital converter with a capacitor connected in parallel to the temperature sensor element.

12. The power supply control circuit according to claim 9, further comprising a resistor (78) configure to store the temperature data output from the analog to digital converter.

13. The power supply control circuit according to claim 9, wherein the temperature sensor element comprises a diode or a bipolar transistor.

14. The power supply control circuit according to claim 9, wherein the interface according to the serial communication standard comprises at least a first wiring configured to transmit a clock signal and a second wiring configured to transmit a data signal.

15. A control method of a memory system comprising a substrate; a first integrated circuit provided on the substrate and comprising a non-volatile semiconductor memory; a second integrated circuit provided on the substrate and comprising a controller configured to control the non-volatile semiconductor memory; a third integrated circuit provided on the substrate and configured to receive a first power supply voltage supplied from an outside of the third integrated circuit and generate a second power supply voltage having a value different from a value of the first power supply voltage, wherein the third integrated circuit is connected to the second integrated circuit via an interface according to a serial communication standard and the third integrated circuit includes a terminal; and a temperature sensor element provided on the substrate and connected to the terminal of the third integrated circuit, the control method comprising:

requesting, by the second integrated circuit, the third integrated circuit to transmit temperature data sensed by means of the temperature sensor element via the interface;

transmitting, by the third integrated circuit, the temperature data via the interface; and transmitting, via the interface, by the second integrated circuit, a voltage adjusting signal in order to adjust a value of the second power supply voltage generated by the third integrated circuit based at least in part on the temperature data transmitted from the third integrated circuit.

* * * * *